(12) United States Patent
Kimata et al.

(10) Patent No.: US 6,234,738 B1
(45) Date of Patent: May 22, 2001

(54) THIN SUBSTRATE TRANSFERRING APPARATUS

(75) Inventors: Kazuo Kimata, Bisai; Katsuhiko Kato, Ichinomiya, both of (JP)

(73) Assignee: MECS Corporation, Aichi-ken (JP)

( * ) Notice: Subject to any disclaimer, the term of this patent is extended or adjusted under 35 U.S.C. 154(b) by 0 days.

(21) Appl. No.: 09/288,513

(22) Filed: Apr. 8, 1999

(30) Foreign Application Priority Data

Apr. 24, 1998 (JP) .................................................. 10-115683

(51) Int. Cl.$^7$ .................................................. B65G 49/07
(52) U.S. Cl. ...................... 414/416; 414/744.3; 414/937; 414/941
(58) Field of Search ................... 414/416, 941, 414/744.3, 744.5, 937; 901/15

(56) References Cited

U.S. PATENT DOCUMENTS

| | | | |
|---|---|---|---|
| 5,746,565 | * 5/1998 | Tepolt | 414/744.5 |
| 5,765,444 | * 6/1998 | Bacchi et al. | 414/744.5 X |
| 5,975,834 | * 11/1999 | Ogawa et al. | 414/744.5 |
| 6,092,971 | * 7/2000 | Balg et al. | 414/941 X |

FOREIGN PATENT DOCUMENTS

| | | | |
|---|---|---|---|
| 366430 | * 5/1990 | (EP) | 901/15 |
| 4157755 | * 5/1992 | (JP) | 414/937 |
| WO 97/35241 | 9/1997 | (WO) . | |

* cited by examiner

Primary Examiner—Steven A. Bratlie
(74) Attorney, Agent, or Firm—Arent Fox Kintner Plotkin & Kahn, PLLC

(57) ABSTRACT

In a thin substrate transferring apparatus of this invention, the transfer stroke of a hand of a robot is lengthened and the swivel radius is made small resulting in a more compact apparatus. The apparatus has cassettes, housing a substrate, a robot transferring the substrate, and at least one processing unit. The robot has a vertical swivel arm body swiveling in the vertical direction on a machine bed, and a horizontal swivel arm body having two arm sets swiveling in the horizontal direction on a movable machine bed. The vertical swivel arm body has a first arm and a second arm respectively joined rotatable in the vertical direction and a hand is moved substantially in parallel in the vicinity of the cassettes, or the processing unit, and the horizontal swivel arm body has a first link and a second link and the hand is moved into the cassettes, or the processing unit.

4 Claims, 18 Drawing Sheets

Fig.5
(a)
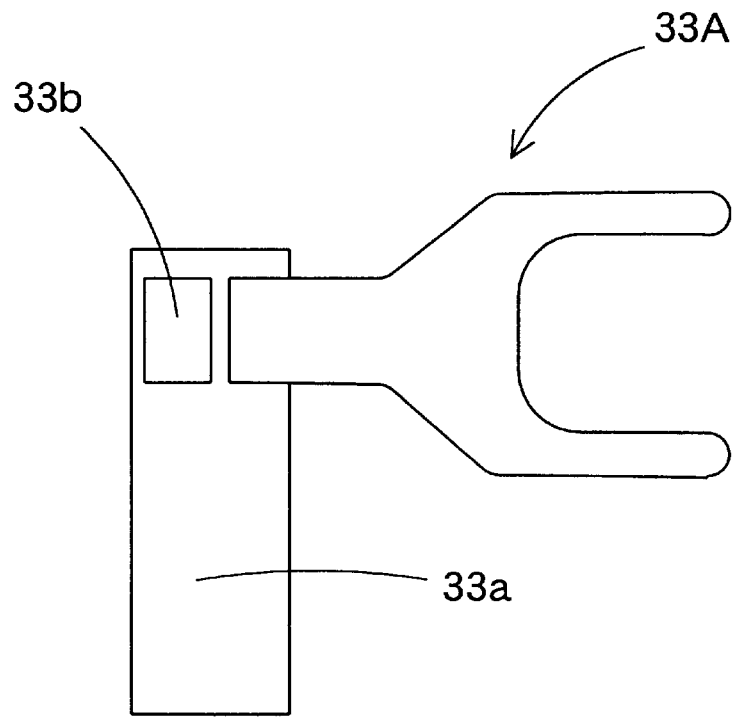
(b)
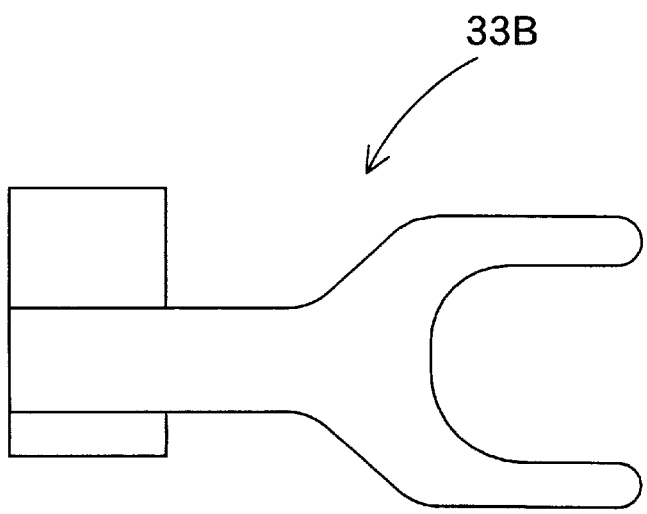

THIN SUBSTRATE TRANSFERRING APPARATUS

BACKGROUND OF THE INVENTION (1) Field of the Invention

The present invention relates to a transferring apparatus for transferring a thin substrate such as a wafer, a glass substrate or the like, and further to a transferring apparatus having an articulated robot constructed so as to reduce the swivel radius.

(2) Description of the Prior Art

In general, a thin substrate, such as a silicon wafer, a glass substrate or the like, is processed and transferred within a clean room. Therefore also a transferring apparatus for transferring a thin substrate is installed within a clean room, and has an arm body to be swiveled in the horizontal direction so that the thin substrate is transferred from the prescribed position to the position for the substrate to be processed. In the prior art, a transfer robot arranged within the transferring apparatus has a hand supporting the thin substrate and a drive unit which rotates the hand or moves it up and down, and the drive unit is arranged within a machine bed. A transfer robot 110 shown in FIG. 16 is known well usually, and has a machine bed 111, an arm body 112 which is rotated or moved up and down with respect to the bed 11 and is flexional, and a hand 113 which is rotatable with respect to the arm body 112 at the top end of the arm body 112. The arm body 112 is constituted by two arms, a first arm 114 which is rotated with respect to the machine bed 111 by a motor (not shown) arranged within the machine bed 111, and a second arm 115 which is adjacent at the top end of the first arm 114. The first arm 114 and the second arm 115 are driven and transmitted by a pulley belt (not shown), and by the driving and transmission, the second arm 115 is rotated with respect to the first arm 114. The robot 110 having the arm body 112 and the hand 113 attracts a thin substrate housed within a cassette (not shown) and is moved linearly, thereby the thin substrate can be taken out or taken in without contacting with both ends of the cassette.

In the transfer robot in the prior art, however, since the hand is moved linearly by the flexion of the two arms, the moving area of the hand is limited. Therefore when there are many processings of the work or when the work is moved to a remote distance in one process, a rail is installed below the robot and the robot itself is moved along the rail. However, when the robot itself is moved, a space for the transferring apparatus itself becomes large and the installation cost is increased. In order to solve the problems, such improvement has been tried that the number of arms is increased and a motor is mounted to a part of respective swivel units and an articulated robot raising the degree of freedom of the moving trajectory of the arm is arranged thereby the transfer stroke of the substrate is lengthened and the moving of the robot itself is eliminated.

However, when the moving of the hand is performed by simply increasing the number of arms and the horizontal swivel is performed, the swivel radius becomes large and the distance between the robot and the cassette within the transferring apparatus or the distance between the processing stage must be set large thereby the apparatus becomes large scale.

SUMMARY OF THE INVENTION

In order to solve the above-mentioned problems in the prior art, an object of the present invention is to provide a thin substrate transferring apparatus which is constructed compactly by decreasing the swivel radius of an arm of a robot.

Therefore a thin substrate transferring apparatus of the present invention comprises at least a cassette for housing a thin substrate, at least one processing unit for processing the thin substrate, and an articulated robot capable of supporting the thin substrate and transferring it to the processing unit, where the articulated robot has primary swivel means driven so as to transfer the thin substrate to the vicinity of the cassette or the processing unit, and secondary swivel means driven so as to transfer the thin substrate into the cassette or the processing unit, and the primary swivel means is supported rotatable to the machine bed and the secondary swivel means is supported to the movable machine bed supported to the primary swivel means and is provided with a hand supporting the thin substrate and is swiveled in the horizontal direction. Since the primary swivel means is moved substantially in parallel to the cassette or the processing unit and the secondary swivel means is moved substantially orthogonal to the cassette or the processing unit separately from the primary swivel means, the transfer stroke of the hand can be lengthened and the swivel radius can be made small. Therefore the distance between the cassette for housing the substrate and the processing unit for processing the substrate can be set short and the whole apparatus can be made compact. Also if the primary swivel means is constituted to be swiveled in the vertical direction, since the movement of the Z-axis and the Y-axis of the hand is performed by the primary swivel means, the Z-axis drive unit of the hand arranged in the prior art can be omitted and the robot itself can be, compact, and also since the movement of the Y-axis of the hand is performed by the primary swivel means, in comparison with the robot in the prior art, the transfer stroke can be lengthened significantly and the apparatus itself can be made compact.

Also if the primary swivel means is swiveled in the horizontal direction, since the movement of the Y-axis of the hand is performed by the primary swivel means, in comparison with the robot in the prior art, the transfer stroke can be lengthened significantly and the apparatus itself can be made compact.

Also if the secondary swivel means has two arm sets, since the substrate can be transferred in or transferred out continuously, the throughput in the processing unit can be improved.

Further if the secondary swivel means has two hands, since the substrate can be transferred in or transferred out continuously, the throughput in the processing unit can be improved.

An articulated robot for transferring a thin substrate according to the present invention comprises primary swivel means driven so as to transfer the thin substrate to the vicinity of a cassette or a processing unit, and secondary swivel means driven so as to transfer the thin substrate into the cassette or the processing unit, where the primary swivel means is supported to be swiveled in the vertical direction to a machine bed, and the secondary swivel means is supported to a movable machine bed supported to the primary swivel means and is provided with a hand supporting the thin substrate and is swiveled in the horizontal direction. Since the primary swivel means is moved substantially in parallel to the cassette or the processing unit and the secondary swivel means is moved substantially orthogonal to the cassette housing the arranged thin substrate or the processing unit for processing the thin substrate separately from the swivel means, the transfer stroke of the hand can be lengthened and the swivel radius can be made small. Therefore the distance between the cassette housing the substrate and the processing unit for processing the substrate can be set short and the whole apparatus can be made compact.

In the robot, if the primary swivel means has two vertical swivel arms joined by the common shaft and the first vertical swivel arm is supported to be swiveled by a first drive motor supported to the machine frame and one end of the second vertical swivel arm is supported to the movable machine bed and is arranged to be swiveled by a second drive motor connected to the common shaft, the primary swivel means can be flexed freely in the vertical direction and the thin substrate can be moved to the vicinity of the processing unit.

Also if the movable machine bed in the robot is arranged to be swiveled by a third drive motor connected to the second vertical swivel arm, the secondary swivel means can be always swiveled in the horizontal direction irrespective of the swivel of the primary swivel means.

Also if the secondary swivel means in the robot has a hand supporting the thin substrate and constitutes two arm sets, since the substrate can be transferred in or transferred out continuously, the throughput in the processing unit can be improved.

Further in the secondary swivel means in the robot, if the two arm sets have a common arm, since one arm and one drive motor driving the arm can drive the secondary swivel means, the secondary swivel means itself can be constituted compactly.

Further if the hand in the robot is provided with a sensor detecting whether or not a thin substrate exists and the hand is controlled to be slanted in conformity with the housing state of the thin substrate housed in the cassette, even if the thin substrate housed in the cassette is slanted, the hand can be corrected in conformity with the slanted substrate and the thin substrate can be attracted and held correctly.

The thin substrate transferring apparatus comprises at least a cassette housing a thin substrate, and an articulated robot capable of supporting the thin substrate and transferring it to the cassette, where the articulated robot has primary swivel means driven so as to transfer the thin substrate to the vicinity of the cassette and secondary swivel means driven so as to transfer the thin substrate into the cassette, and the primary swivel means is supported rotatable to a machine bed and the secondary swivel means is supported to a movable machine bed supported to the primary swivel means and is provided with a hand supporting the thin substrate and is swiveled in the horizontal direction. Since the primary swivel means is moved substantially in parallel to the cassette and the secondary swivel means is moved substantially orthogonal to the cassette separately from the primary swivel means, the transfer stroke of the hand can be lengthened and the swivel radius can be made small. Therefore the distance between the cassettes housing the substrate can be set short and the whole apparatus can be made compact.

BRIEF DESCRIPTION OF THE DRAWINGS

FIG. 5a is a plan view showing a hand of the robot in FIG. 3;

FIG. 5b is a plan view showing a hand of the robot in FIG. 3;

DESCRIPTION OF THE PREFERRED EMBODIMENTS

An embodiment of the present invention will be described referring to the accompanying drawings as follows.

Figure 1:
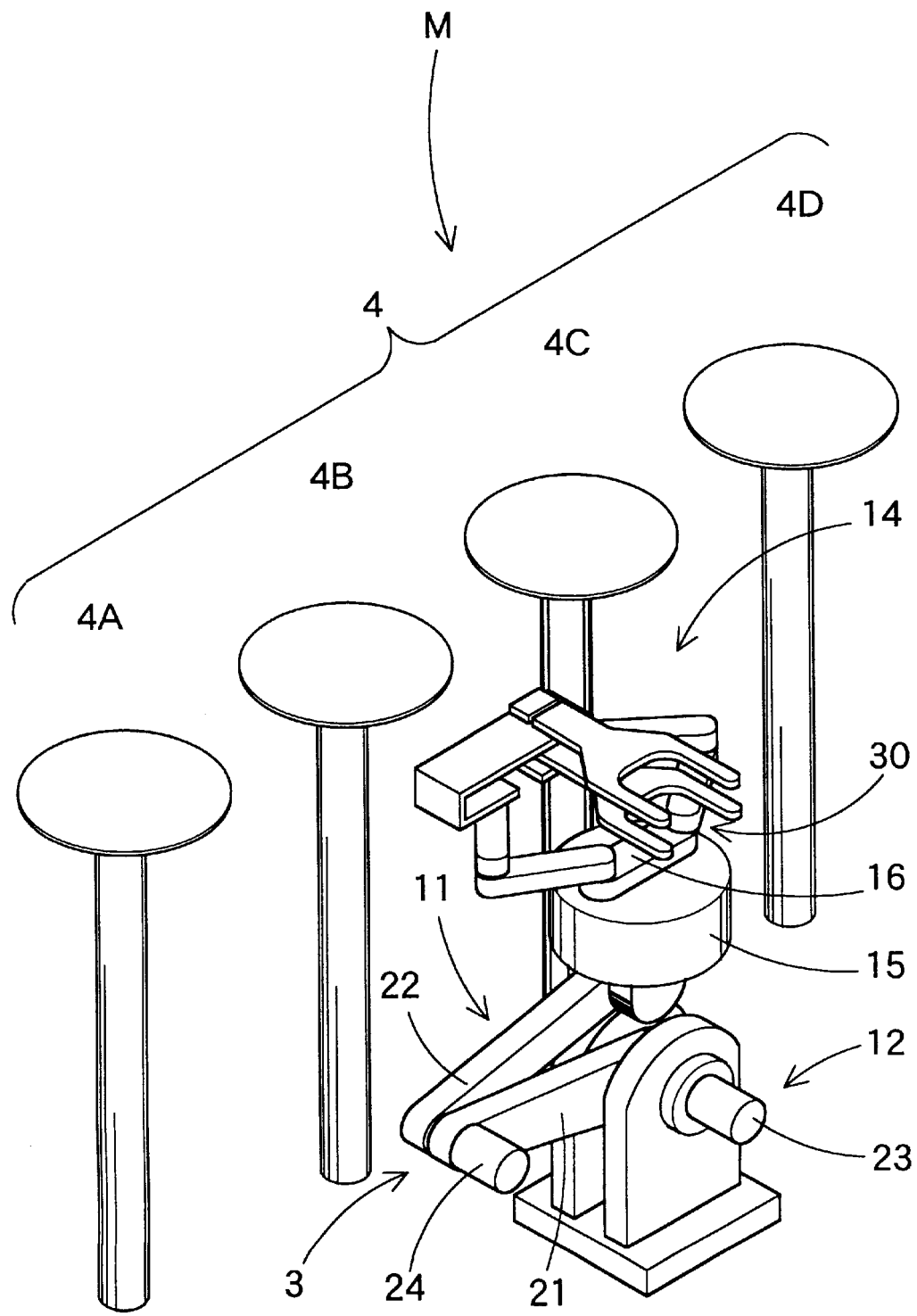
FIG. 1 is a perspective view showing a part of a transferring apparatus in an embodiment of the invention.

A thin substrate transferring apparatus (hereinafter referred to as "apparatus") M in this embodiment, as shown in a perspective view of FIG. 1 and a plan view of FIG.2, comprises a cassette 1 housing a substrate W before the processing, a cassette 2 housing a substrate W after the processing, an articulated robot (hereinafter referred to as "robot") 3 transferring the substrate W, and a plurality of processing units 4A, 4B, 4C, 4D arranged in opposition thereto with respect to the robot 3. The cassettes 1, 2 and the processing units 4A, 4B, 4C, 4D are set substantially in parallel along transfer direction of the robot 3, and the robot 3 is operated so as to transfer the substrate W within the cassette 1 to any of the processing units 4.

In addition, the setting number of the cassettes and the processing units is not limited to the above description, but the cassettes and the processing units may be set in the same number or the cassettes may be set more than the processing units. Further this apparatus may be that performing the transfer between the two or more cassettes without setting any processing unit. The following description will be performed in the state that shown in the figures.

Figure 2:
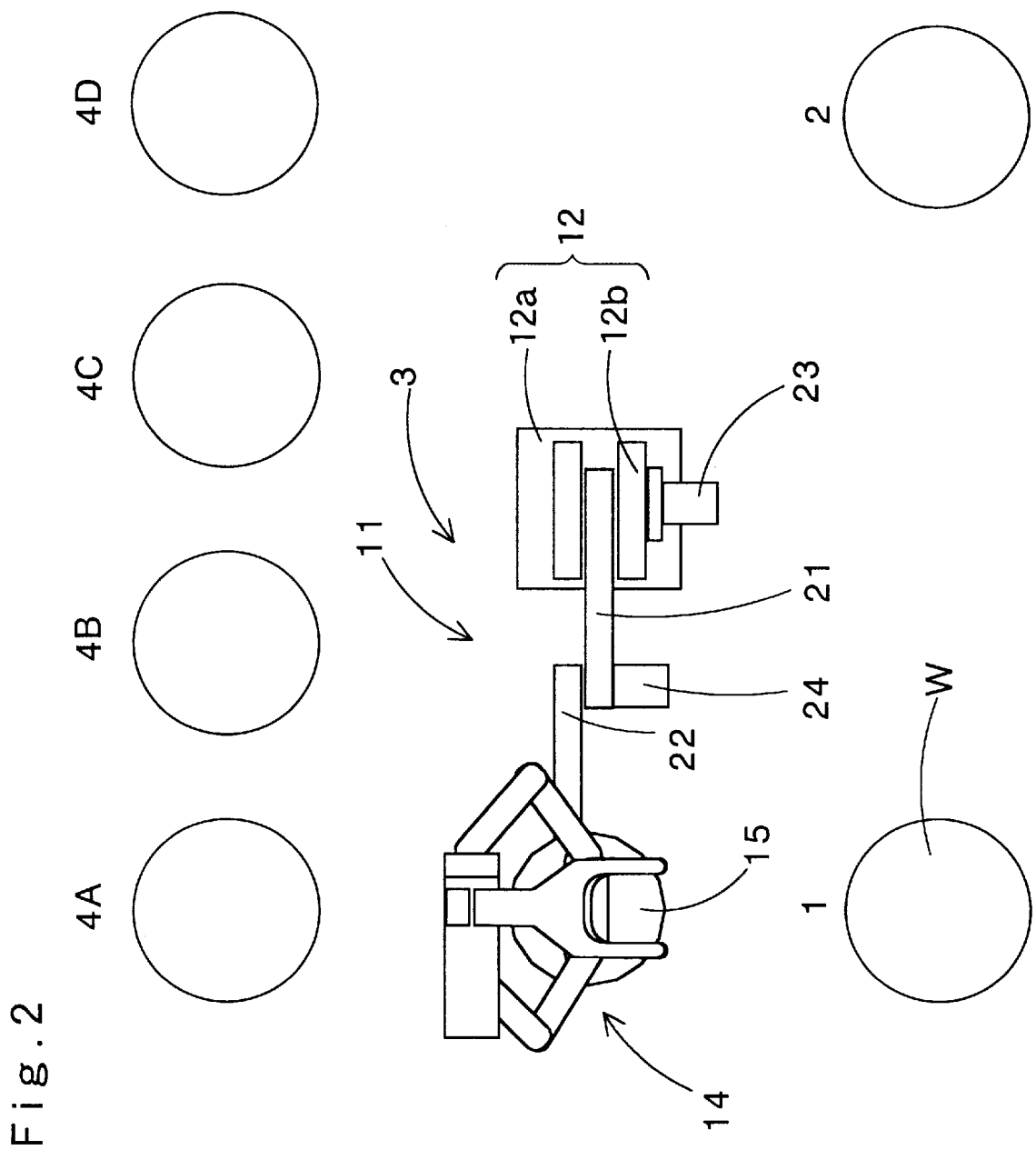
FIG. 2 is a plan view of the transferring apparatus in FIG. 1.
Figure 3:
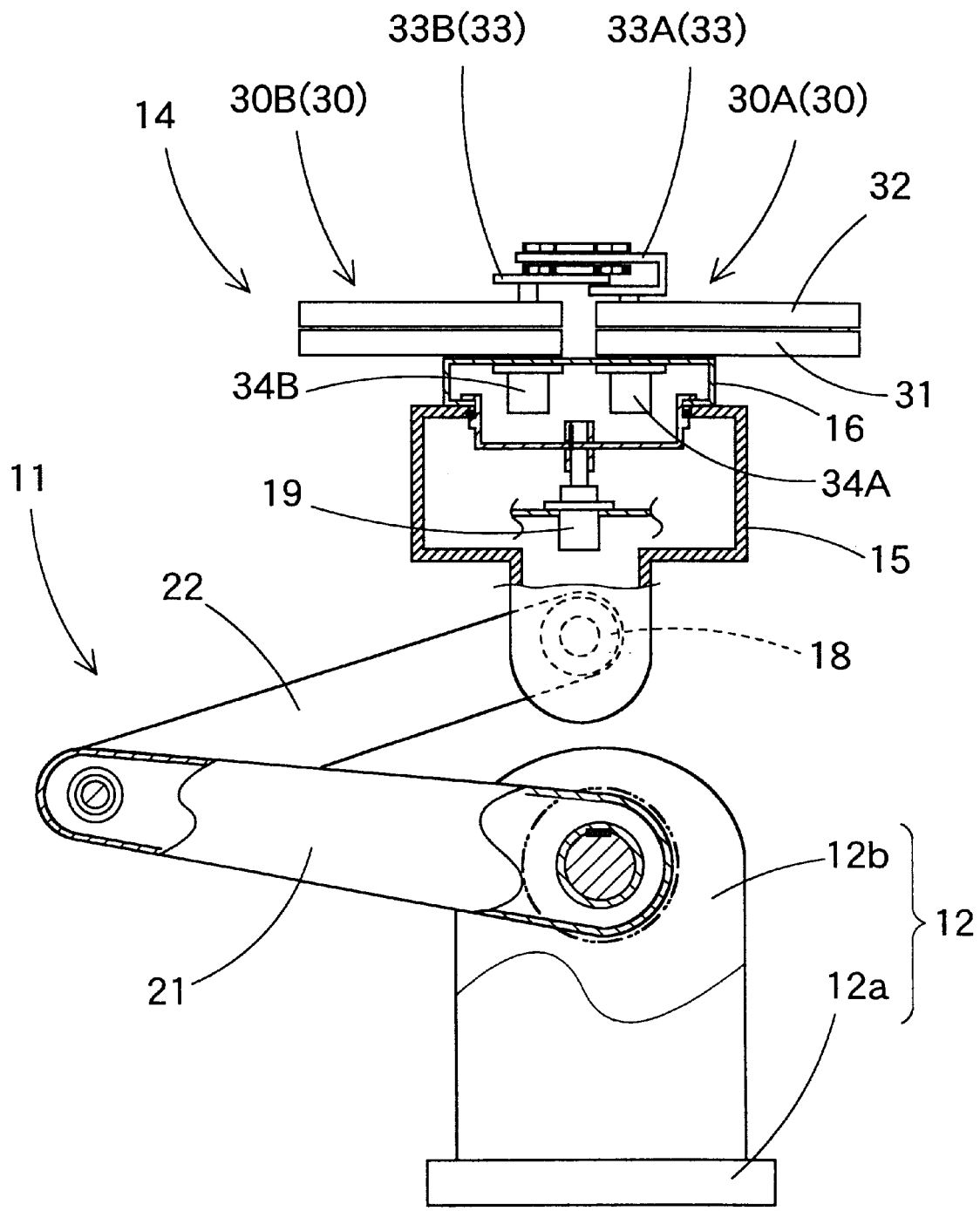
FIG. 3 is a front view partly in section showing a robot in FIG. 1.

The robot has a primary swivel arm body (primary swivel means) and a secondary swivel arm body (secondary swivel means) and make the swivel radius small, and in the robot 3 in the first embodiment as shown in FIGS. 2–3, a vertical swivel arm body 11 as primary swivel arm body is supported rotatable in the vertical direction on a machine bed 12, and a horizontal swivel arm body 14 as secondary swivel arm body is supported rotatable in the horizontal direction to a movable machine bed 15 through a rotary base 16.

The vertical swivel arm body 11 has two vertical swivel arms (first arm 21 and second arm 22) in hollow shape, and one end of the first arm 21 and one end of the second arm 22 are rotatably connected to each other, and other end of the first arm 21 is supported by the machine bed 12 and other end of the second arm 22 is rotatably connected to the movable machine bed frame 15. The first arm 21 is swiveled and driven by a motor 23 (refer to FIG. 1 or FIG. 2) supported to the machine bed 12, and the second arm 22 is swiveled and driven by a motor 24 (refer to FIG. 1 or FIG. 2) supported by the first arm 21. The machine bed 12 comprises one horizontal plate 12a and two vertical plates 12b in order to perform the vertical swivel of the first arm 21, and the first arm 21 is supported between the two vertical plates 12b and is driven and connected by the motor 23.

Figure 4:
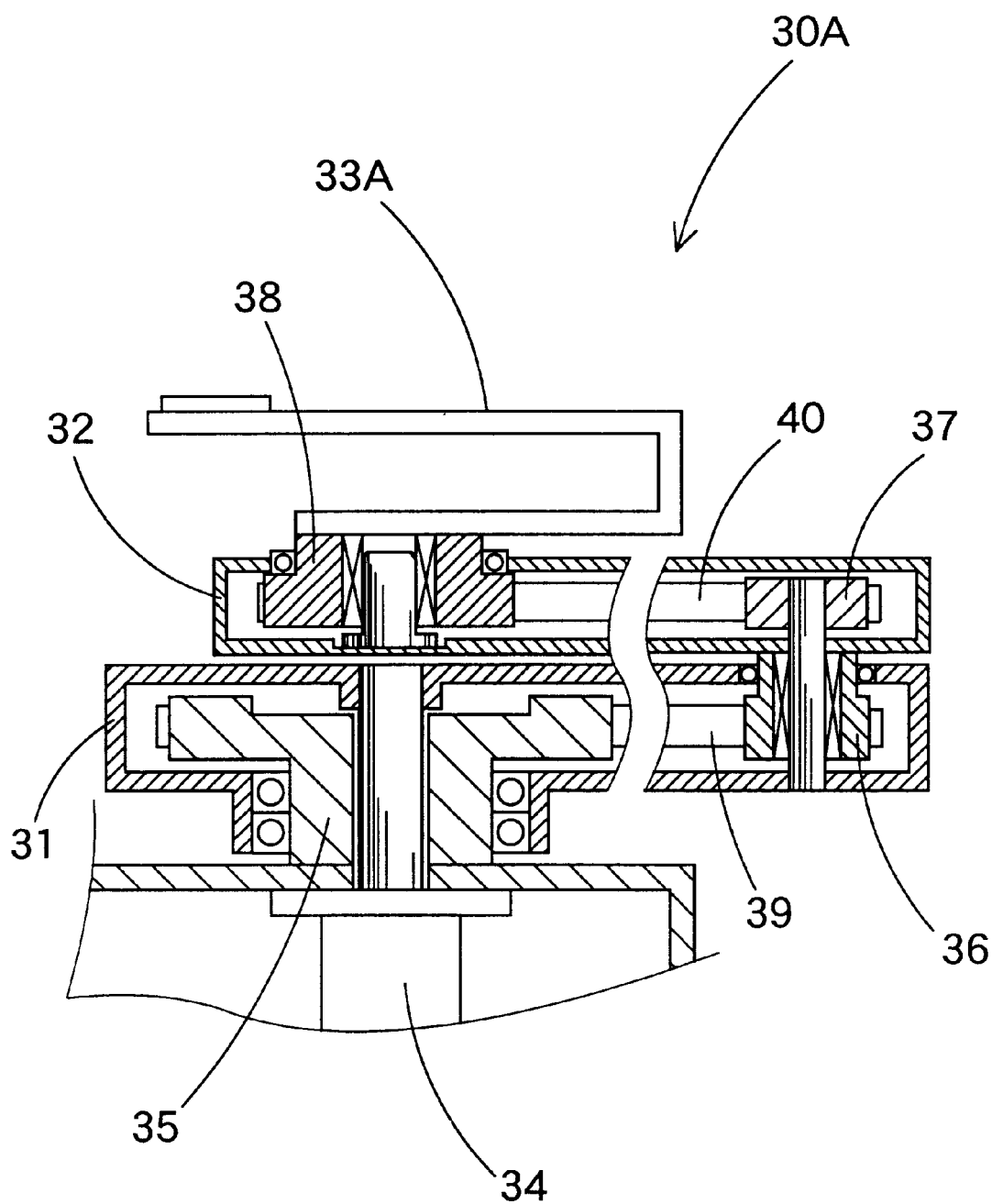
FIG. 4 is a sectional view showing one arm set of the robot in FIG. 3.

The horizontal swivel arm body 14 in the first embodiment, as shown in FIGS. 3–4, has two arm sets 30 (first arm set 30A and second arm set 30B), and each of the first and second arm sets 30A and 30B has a first link 31, a second link 32 and a hand 33 and respective arm sets 30 are provided with a drive mechanism moving the top end portion of the hand 33 linearly. The drive mechanism may be that having construction well known in the prior art (for example, JP-A 9-285981 by the present applicant in FIG. 1). That is, the drive mechanism has a motor 34 supported within a rotary base 16, two pulleys 35, 36 and two pulleys 37, 38 arranged respectively within a first link 31 and a second link 32, and belts 39, 40 wrapped between the pulleys 35 and 36 and between the pulleys 37 and 38 respectively. The second link 32 is rotated with respect to the first link 31 at the top end portion of the first link 31, and the hand 33 is rotated with respect to the second link 32 at the top end portion of the second link 32. In the following description, when each portion of the two arm sets is to be explained, each portion of the first arm set 30A is designated by reference numeral with symbol A added thereafter, and each portion of the second arm set 30B is designated by reference numeral with symbol B added thereafter. For example, the hand in the first arm set 30A is designated by 33A and the hand in the second arm set 30B is designated by 33B.

The movable machine bed 15 is supported at lower side to the top end portion of the second arm 22 of the vertical swivel body 11 and can be rotated with respect to the extending direction of the vertical swivel arm body 11 by a motor 18 (shown by broken line in FIG. 3) supported by the second arm 22, and the rotary base 16 is supported rotatable (θ rotation) along the axial center of the movable machine bed 15 by a motor 19 for rotation supported within the movable machine bed 15.

Also as shown in FIG. 5, respective hands 33A (FIG. 5(a)) and 33B (FIG. 5(b)) supported to the top end portion of the two arm sets 30A, 30B are formed in that one hand 30A has a support part 33a of U-like shape and has a spacing in the vertical direction so that when the respective arm sets 30A, 30B are moved a substrate attracted and supported to one hand 30B does not interfere. Further the hand 33A is provided with a substrate existence detecting sensor 33b.

In the transferring apparatus M as above described, one arm set 30A (or 30B) of the horizontal swivel arm body 14 of the robot 3 is extended thereby the hand 33A attracts and holds the substrate W within the cassette 1 and takes it out of the cassette 1, and the rotary base 16 is rotated and the vertical swivel arm body 11 is extended thereby the substrate W is transferred in the vicinity of any of the processing units 4 and the substrate W after finishing the processing is again attracted and held by the hand 33 of the horizontal swivel arm body 14 and is housed in the cassette 2. The action will be described in sequence as follows.

Figure 6:
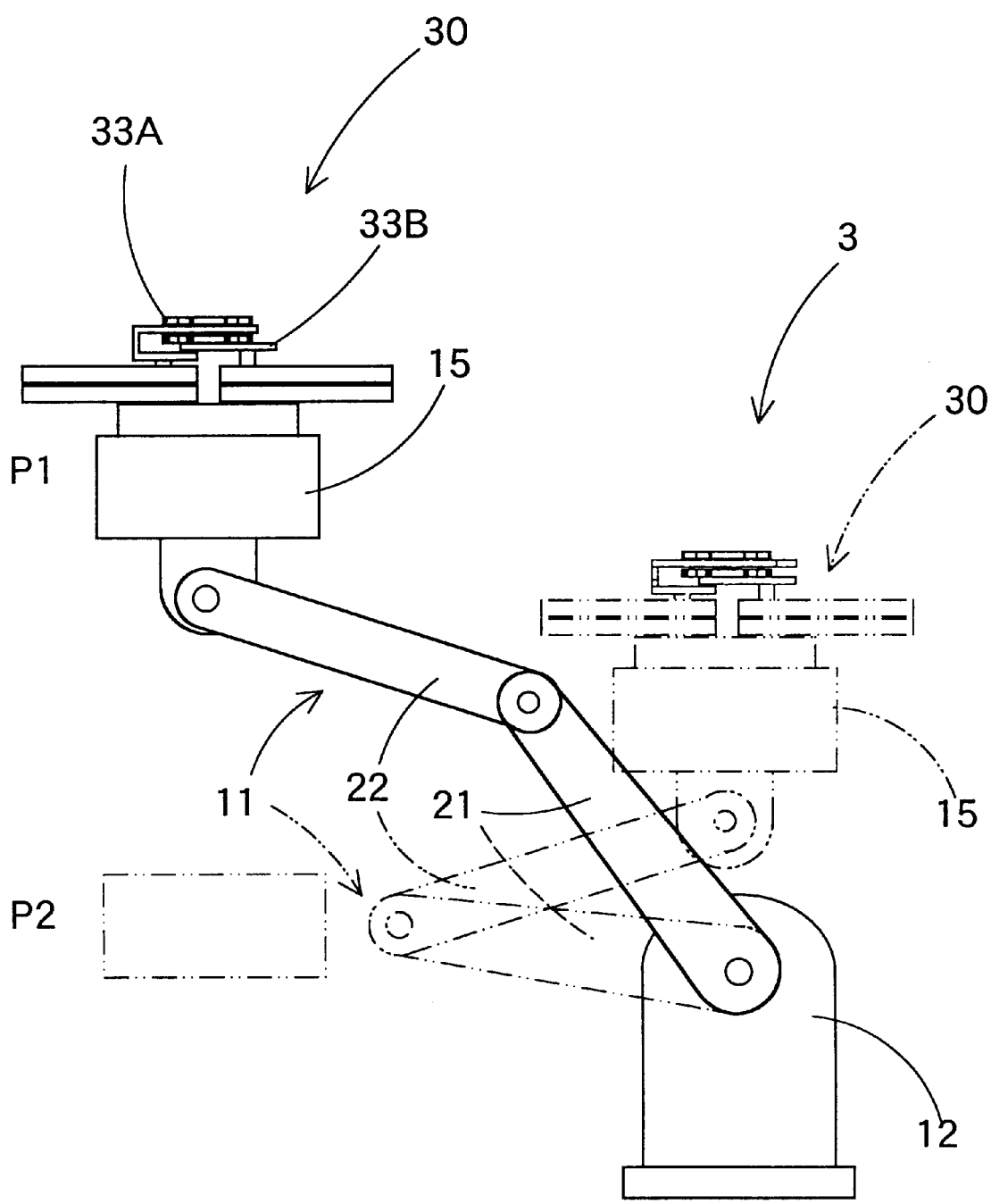
FIG. 6 is a front view showing action of a vertical swivel arm body of the robot.

First as shown in dash-and-dot line in FIG. 6, the movable machine bed 15 is arranged immediately above the machine bed 12 and the two arm sets 30 of the robot 3 wait so that respective hands 33A, 33B are directed to the cassette side. In this state the vertical swivel arm body 11 are flexed and the first arm 21 and the second arm 22 are positioned substantially in the horizontal direction.

Subsequently as shown in solid line in FIG. 6, the motors 23, 24 are operated and the vertical swivel arm body 11 is swiveled and the hand 33A is moved to the position opposite to the upper front surface of the cassette 1 (primary swivel). In this state, the motors 23, 24 (refer to FIG. 1) are further operated, and in order to confirm the existence of all substrates W housed in the cassette 1, the movable machine bed 15 (hand 33A) is moved up and down between positions P1 and P2. During the movement up and down, a detection sensor 33b (refer to FIG. 5) mounted on the hand 33A projects light toward the side surface of the substrate W and detects whether or not the substrate W exists. Whether or not the substrate W exists within the cassette 1 is stored in a controller (not shown), and in the state of taking out the substrate subsequently, the detected substrate W is taken out in sequence from the upper stage (or lower stage).

Figure 7:
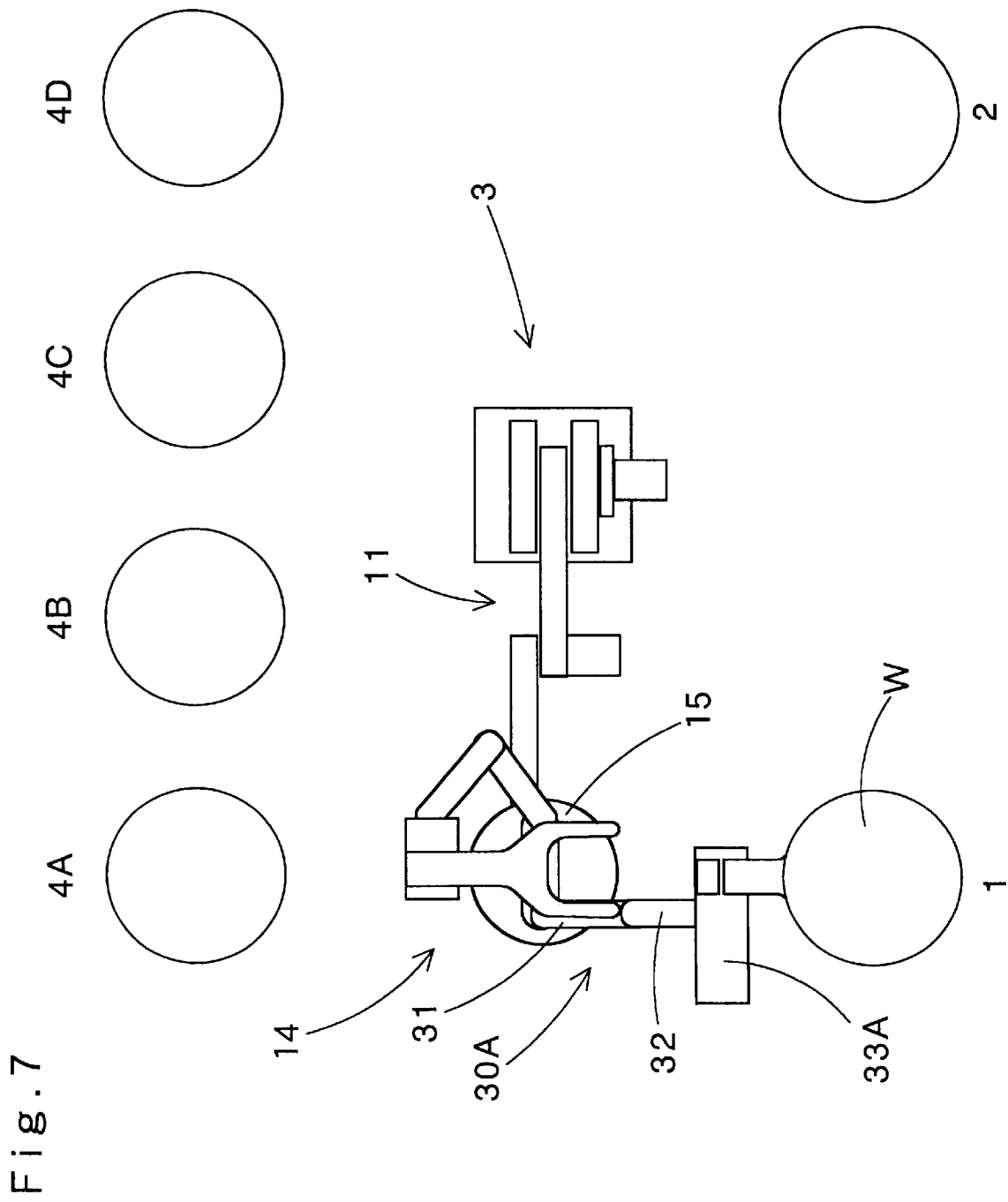
FIG. 7 is a plan view showing action for the robot to take out a substrate within a cassette.

Next, to the hand 33A waiting at the position opposite to the front surface of the substrate W at the uppermost stage of the cassette 1, the first link 31 and the second link 32 of one arm set 30A of the horizontal swivel arm body 14 are driven by the motor 34A (refer to FIG. 3), as shown in FIG. 7, the arm set 30A is extended toward the cassette 1 and the hand 33A is moved to the lower side of the substrate W (second swivel).

Figure 8:
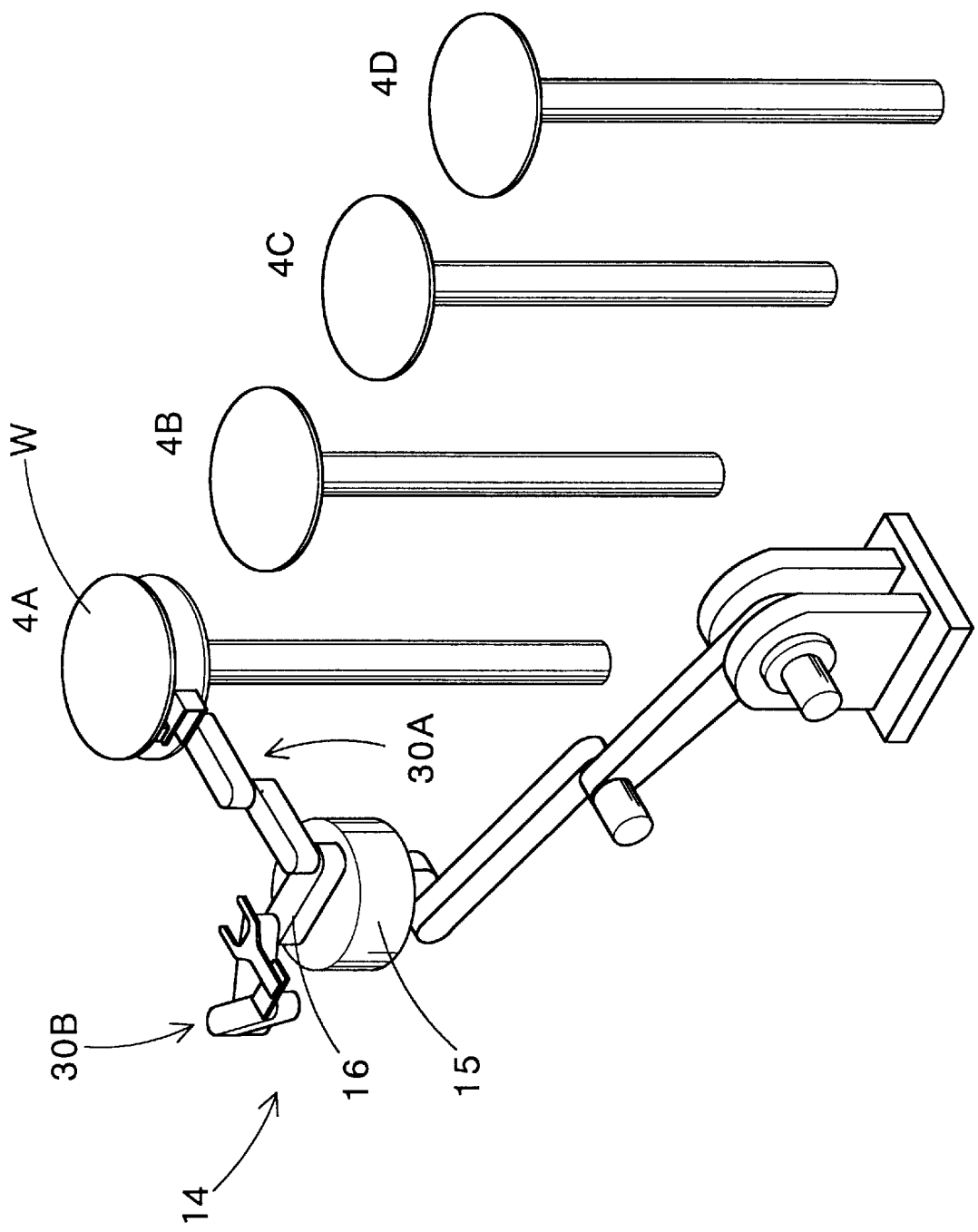
FIG. 8 is a perspective view showing action for the robot to transfer the substrate into a processing unit.

If the hand 33A attracts and holds the substrate W. while holding the substrate W, the hand 33A flexes the arm set 30A and is moved linearly to the original position. At the position, by the operation of the rotating motor 19 within the movable machine bed 15, the rotary base 16 is rotated, and as shown in FIG. 8, the hand 33A is opposed, for example, to the processing unit 4A and the substrate W is transferred onto the processing unit 4A.

After the hand 33A of the arm set 30A transfers the substrate W into the processing unit 4A, the flexion of the arm set 30A is performed and the rotary base 16 is rotated and the hand 33A is again directed to the cassette 1 so as to take out next substrate. If the substrate W is attracted and held as above described, the hand 33A is moved to the position opposite to the processing unit 4A and waits.

Figure 9:
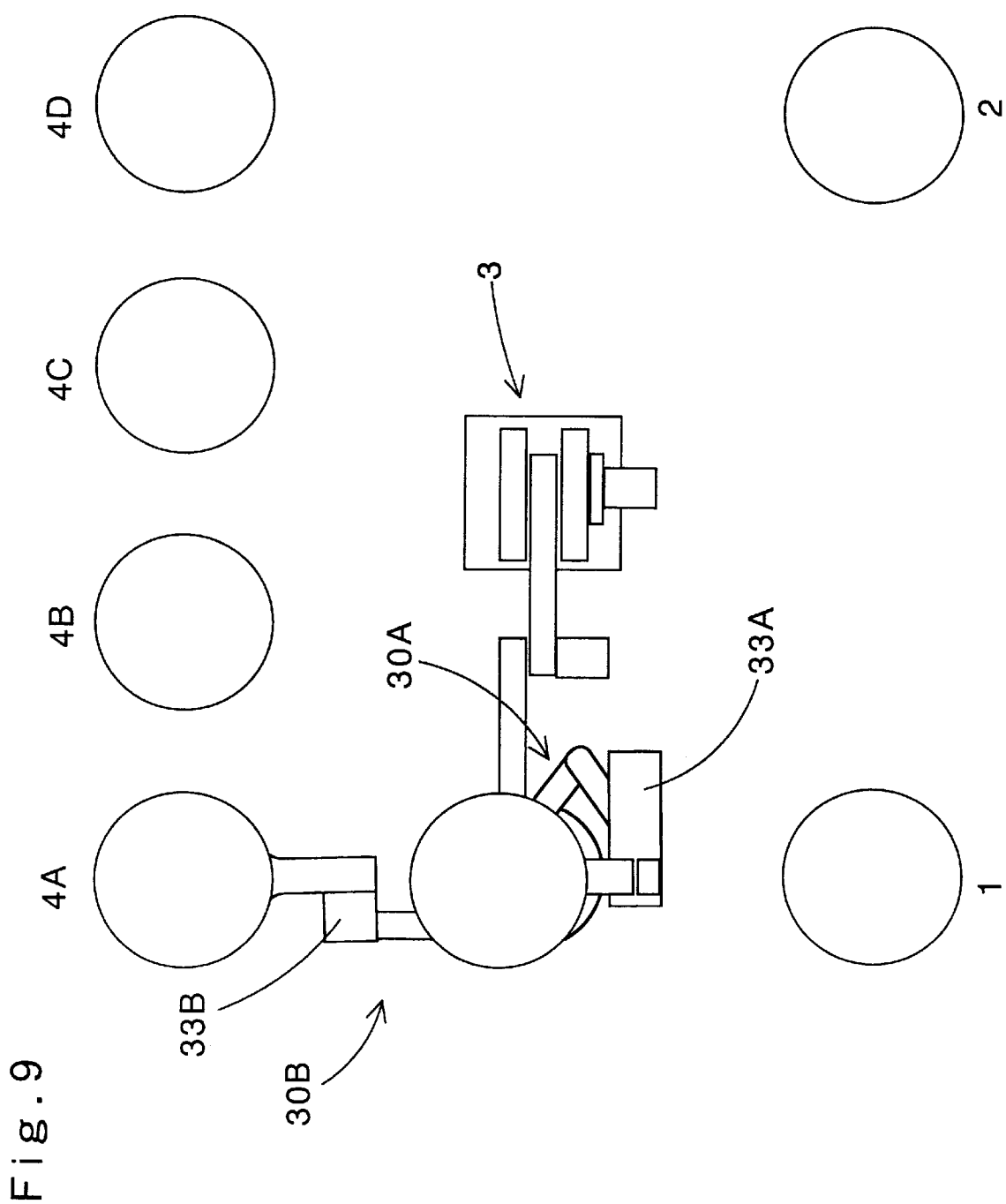
FIG. 9 is a plan view showing action that the substrate within the processing unit is exchanged by the robot.

If the processing is completed in the processing unit 4A, in the robot 3 as shown in FIG. 9, the hand 33B of the arm set 30B, which does not hold the substrate, is extended so as to transfer the substrate W of the processing unit 4A by the operation of the motor 34B. In this case, the hand 33A waits on the movable machine bed 15 where next substrate W is attracted and held.

If the hand 33B of the arm set 30B attracts and holds the substrate w already processed and is restored to the original position, the hand 33A is extended so as to transfer the next substrate W into the processing unit. When the substrate W already processed is held to the hand 33B and is restored and moved, since the substrate W held to the hand 33B passes through the space part of the holding part 33a of U-like shape formed on the hand 33A, the substrate W does not interfere.

If the next substrate W is transferred into the processing unit 4A and the hand 33A is restored to the original position, the movable machine bed 15 performs the flexion by the primary swivel of the vertical swivel arm body 11 and is moved in parallel to the cassettes 1, 2 and is moved to the front surface of the cassette 2 already processed. The substrate W is processed in the processing unit and held to the hand 33B and then is housed in the cassette 2 by the secondary swivel of the arm set 30B.

Subsequently the hand 33A is again moved to the position opposite to the cassette 1 so as to take out next substrate W from the cassette 1 further. This processing is repeated.

As in the action as above described, in the robot 3, since the primary swivel is performed in the vertical swivel arm body 11 and the secondary swivel is performed in any of the arm set 30, the swivel radius can be made small and the apparatus itself can be made compact. Moreover since the robot 3 can perform the moving of the Z-axis to move the hand up and down in the primary swivel, the machine bed 12 can be made quite compact.

Further in the robot 3, when the substrate W housed in the cassette 1 before the processing is arranged slantwise with respect to the horizontal direction, the motor 19 is operated in conformity with the slant of the substrate W and the movable machine bed 15 is rotated with respect to the second arm 22 and the hand 33 can be taken out while it is slanted and further the hand 33 can be reversed and the substrate w can be attracted at lower side of the hand 33.

In addition, the horizontal swivel arm body performing the secondary swivel need not be constituted by the two arm sets, but may be constituted by one arm set. Further constitution of the two arm sets is not limited to the above description, but that usually known may be adopted.

Figure 10:
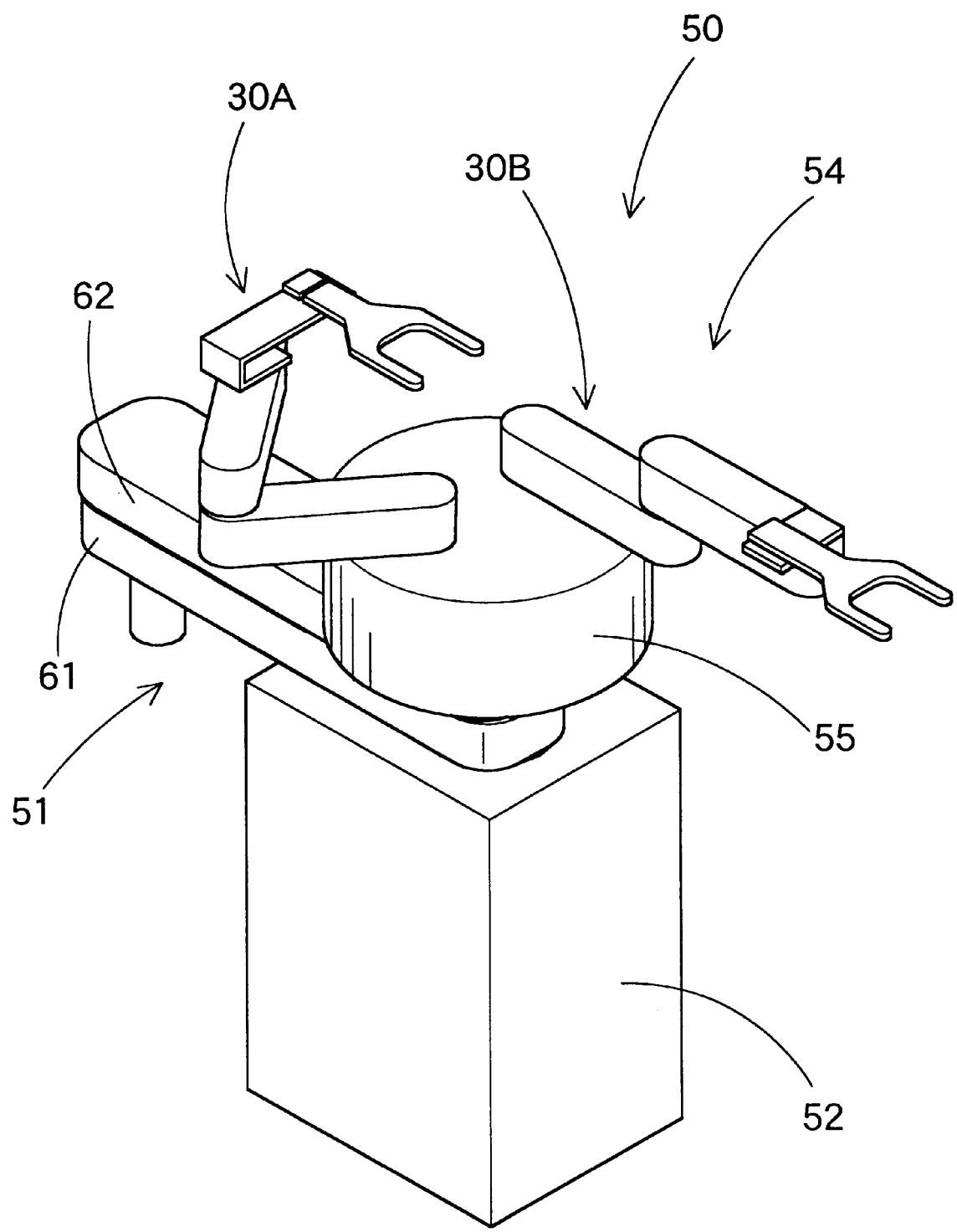
FIG. 10 is a perspective view showing a robot in a second embodiment.

A robot in a second embodiment shown in FIG. 10 performs the primary swivel by the horizontal swivel. In a robot 50, a lower horizontal swivel arm body 51 as primary swivel means is supported rotatable in the horizontal direction to a machine bed 52, and an upper horizontal swivel arm body 54 as secondary swivel means is supported rotatable in the horizontal direction to a movable machine bed 55. In the upper horizontal arm 54, two arm sets 30A, 30B are adopted in similar manner to the first embodiment.

Figure 11:
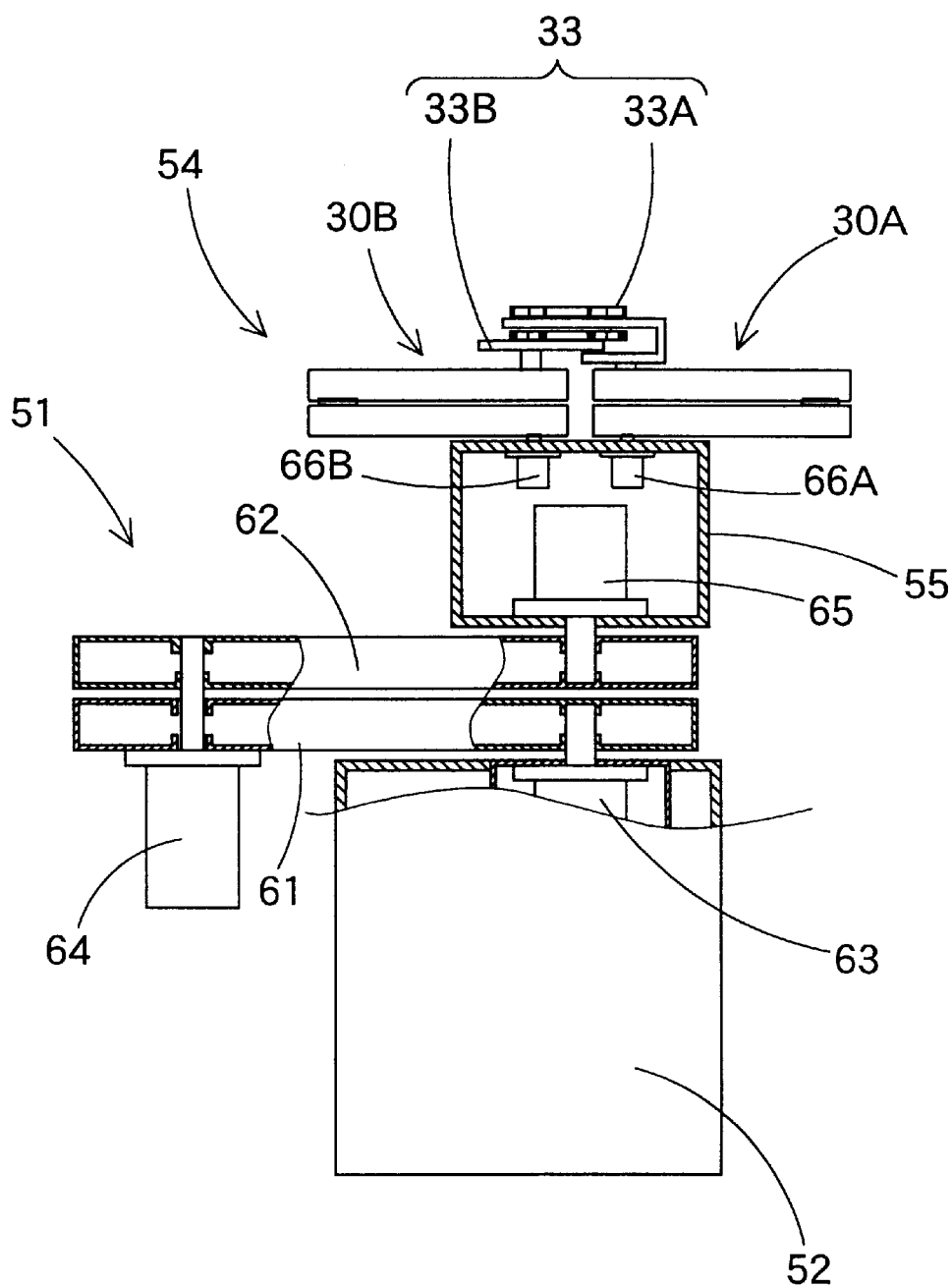
FIG. 11 is a front view partly in section showing inner structure of the robot in FIG. 10.

The lower horizontal swivel arm body 51 as shown in FIG. 11 has a first arm 61 and a second arm 62 and is supported rotatable at respective end portions, and one end of the first arm 61 is supported to the machine bed 52 and one end of the second arm 62 is supported to the movable machine bed 55. Further the lower horizontal swivel arm body 51 performs the up/down moving (Z-axis moving) by a drive unit (not shown) mounted within the machine bed 52, and the first arm 61 is swiveled horizontally by a motor 63 supported within the machine bed 52 and the second arm 62 is swiveled horizontally by a motor 64 supported to one end of the first arm 61. A motor 65 joined with the second arm 62 is supported within the movable machine bed 55, and the movable machine bed 55 is rotated with respect to the second arm 62 by operating the motor 65. By the rotation of the movable machine bed 55, when the lower horizontal swivel arm body 51 is swiveled, the respective hands are directed to the definite direction, and when the lower horizontal arm body 51 is stopped, the upper horizontal swivel arm body 54 as a whole is rotated ($\theta$ rotation). Further motors 66A, 66B for swiveling respective arm sets 30A, 30B are mounted on the upper side within the movable machine bed 55.

Figure 12:
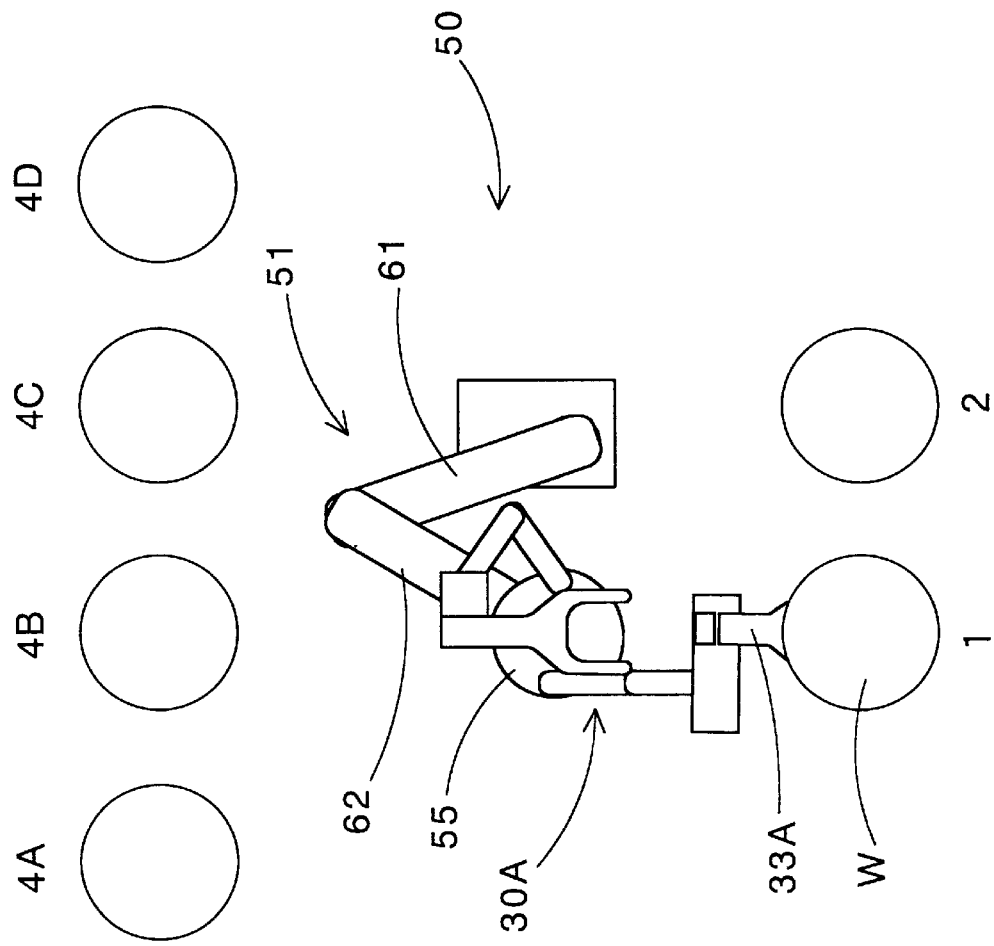
FIG. 12 is a plan view showing action of the robot in FIG. 10.
Figure 13:
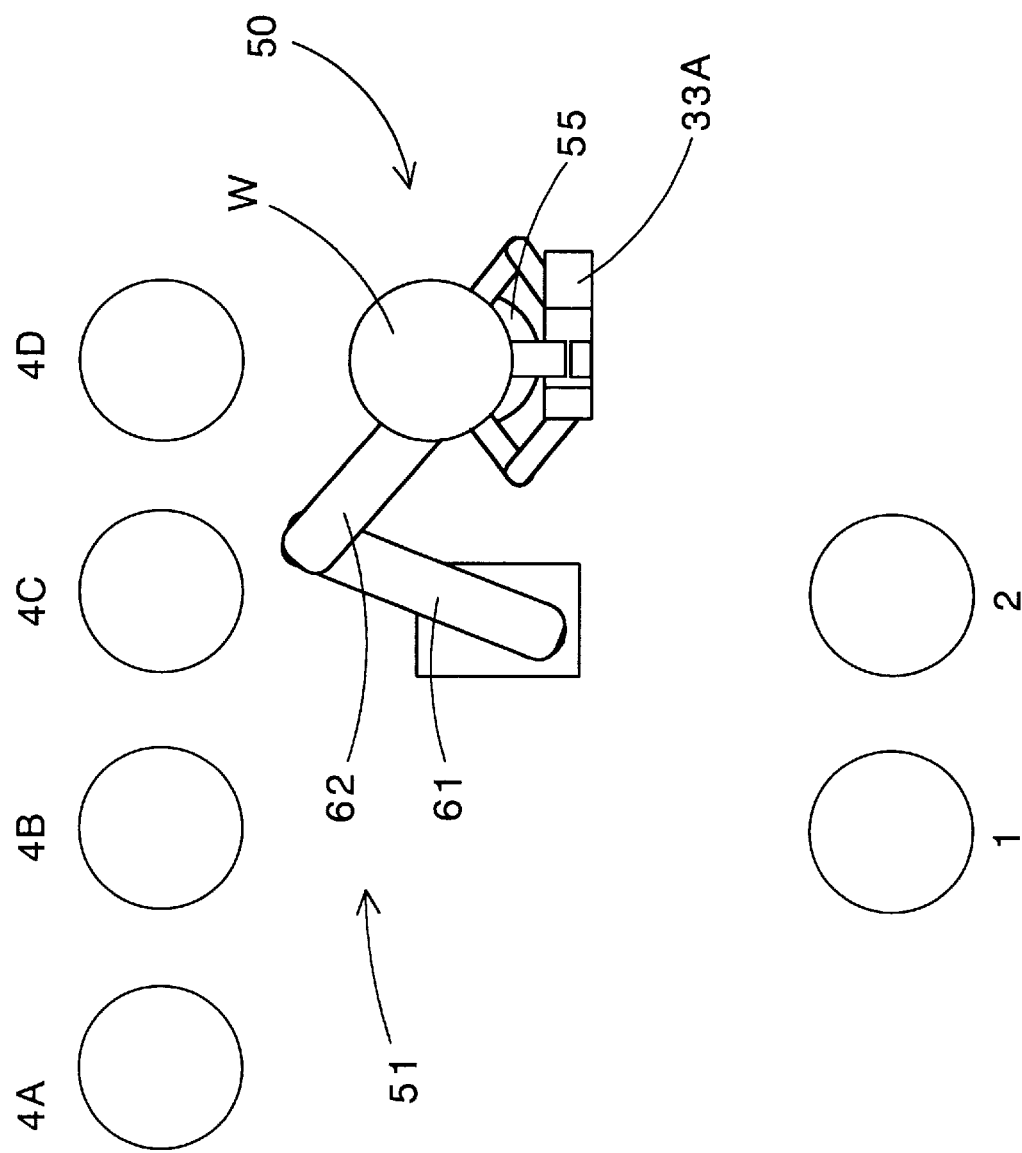
FIG. 13 is a plan view showing action of the robot in FIG. 10.
Figure 14:
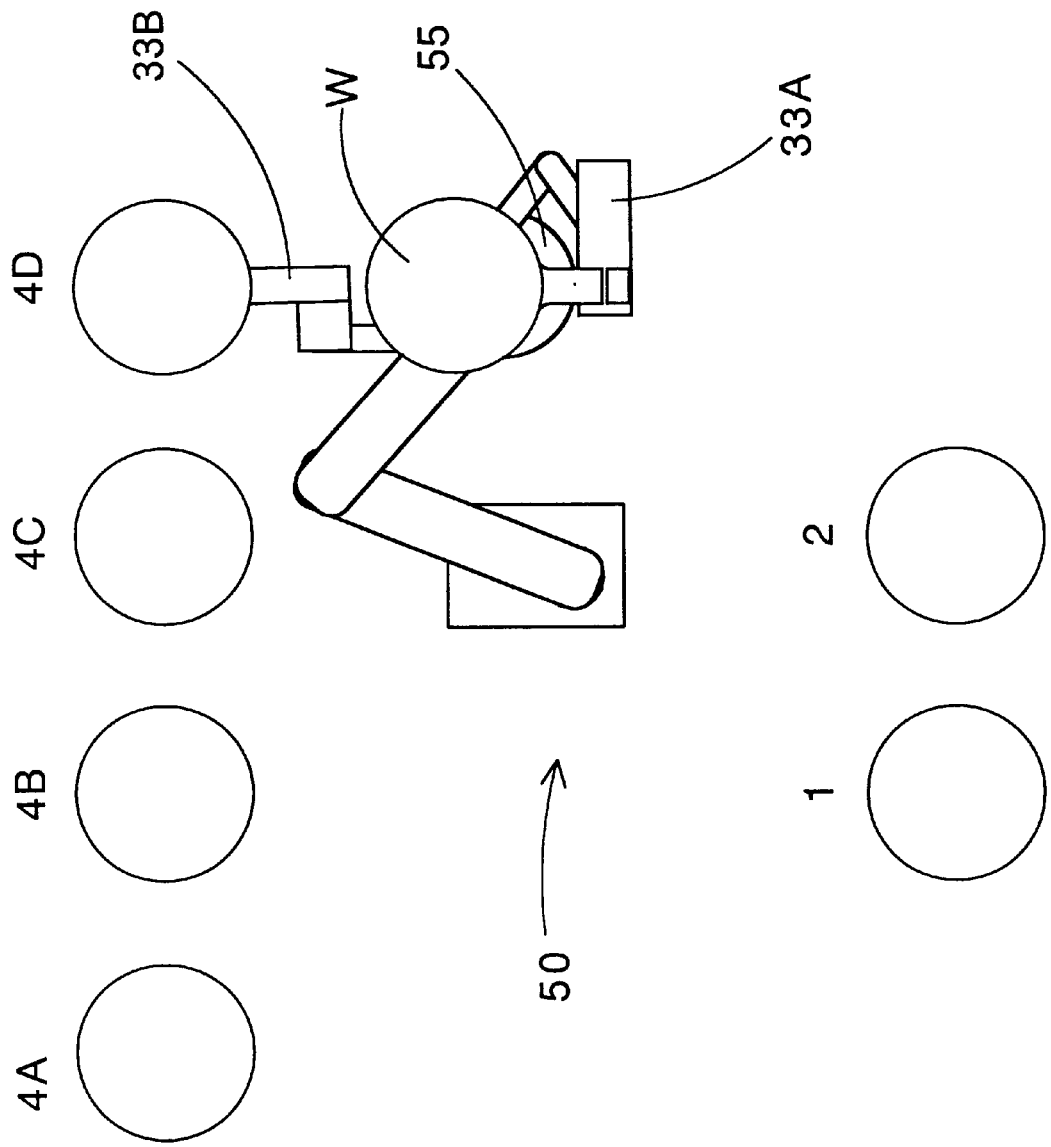
FIG. 14 is a plan view showing action of the robot in FIG. 10.

The robot 50 in this embodiment is operated as shown in FIGS. 12–14. In comparison with the first embodiment, the upper horizontal swivel arm body 54 is operated similarly and the movement of the lower horizontal swivel arm body 51 is different.

In similar manner to the first embodiment, in order to take out the substrate W before the processing, the robot 50 swivels the first arm 61 and the second arm 62 of the lower horizontal swivel arm body 51 by operating respective motors, thereby the hand 33A is opposed to the front surface of the cassette 1 and it is confirmed whether or not the substrate exists, and then as shown in FIG. 12, the hand 33A of one arm set 50A enters the cassette 1 and attracts and holds the substrate W. After the substrate W is attracted and held, the arm set 30A is once flexed and the hand 33A is returned and the first arm 61 and the second arm 62 of the lower it horizontal swivel arm body 51 are swiveled respectively, also the movable machine bed 55 is rotated in the $\theta$ rotation and the substrate W is transferred, for example, into the processing unit 4D as shown in FIG. 13.

After transferring the substrate W into the processing unit 4D, the hand 33A is again opposed to the front surface of the cassette 1 and takes out the substrate W from the cassette 1 and waits at the position opposite to the front surface of the processing unit 4D. As shown in FIG. 14, the substrate W already processed in the processing unit 4D is attracted and held and transferred in that other hand 33D not holding a substrate is moved into the processing unit 4D. When the hand 33B returns the substrate W onto the movable machine bed 55, the hand 33A holding next substrate W is extended and transfers the substrate W into the processing unit 4D. While the processing unit 4D processes the new substrate W, the substrate W held to the hand 33B is housed in the cassette 2 for the substrate already processed and the hand 33A again takes further next substrate out of the cassette 1 and waits in front of the processing unit 4D. This operation is repeated.

Also in this embodiment, although the two arm sets 50 are adopted in the upper horizontal swivel arm body 54, of course, one set of arm body may be constituted or other two arm sets may be constituted without being limited to the above description. Regarding the mechanism that the first arm 61 and the second arm 62 of the lower horizontal swivel arm body 51 and the movable machine bed 55 are driven, the system by individual motors as above described need not be used, but as shown in FIG. 4, the pulley and the belt means arranged within respective arms may be used.

Figure 15:
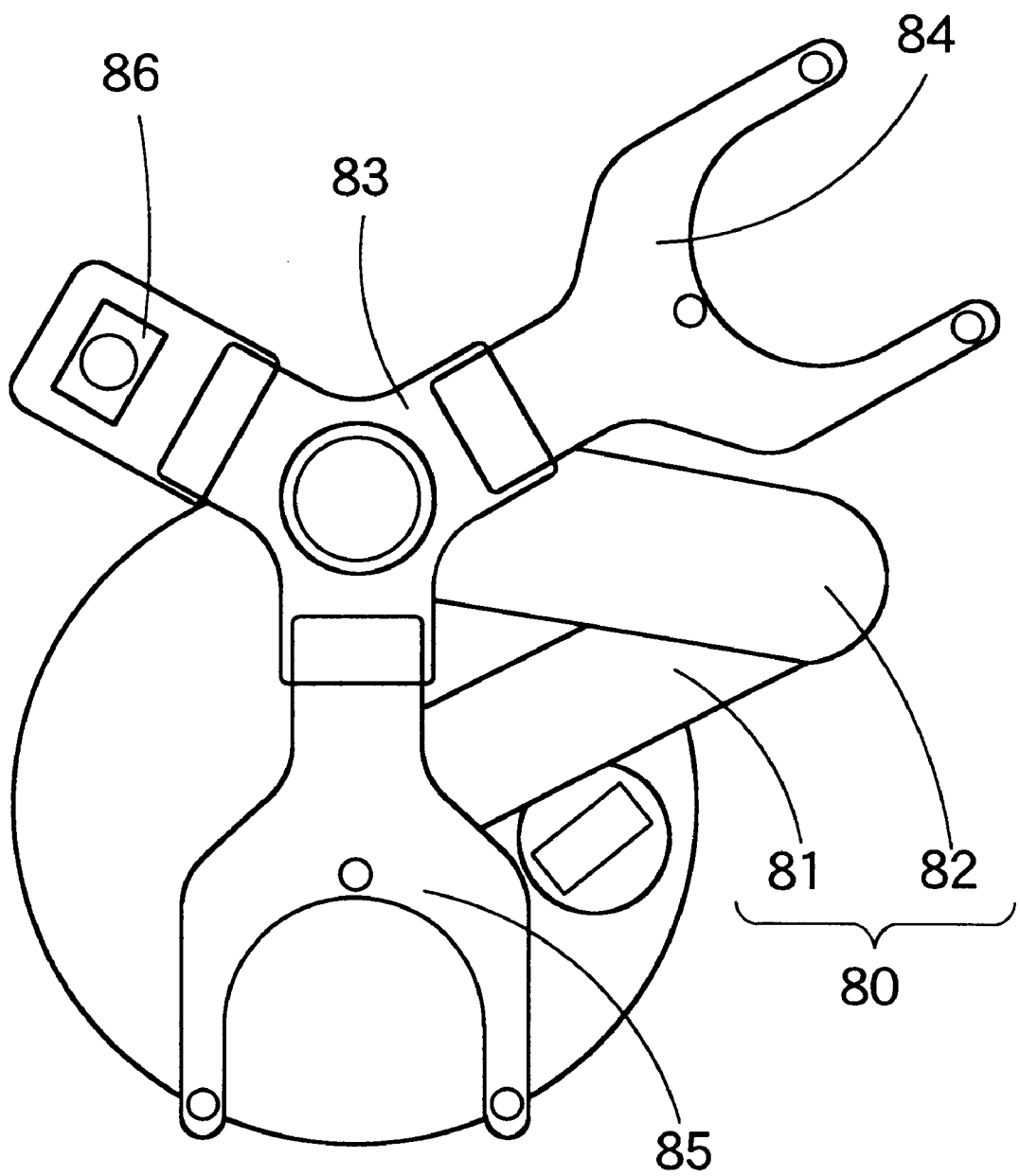
FIG. 15 is a plan view showing a hand in another embodiment.
Figure 16:
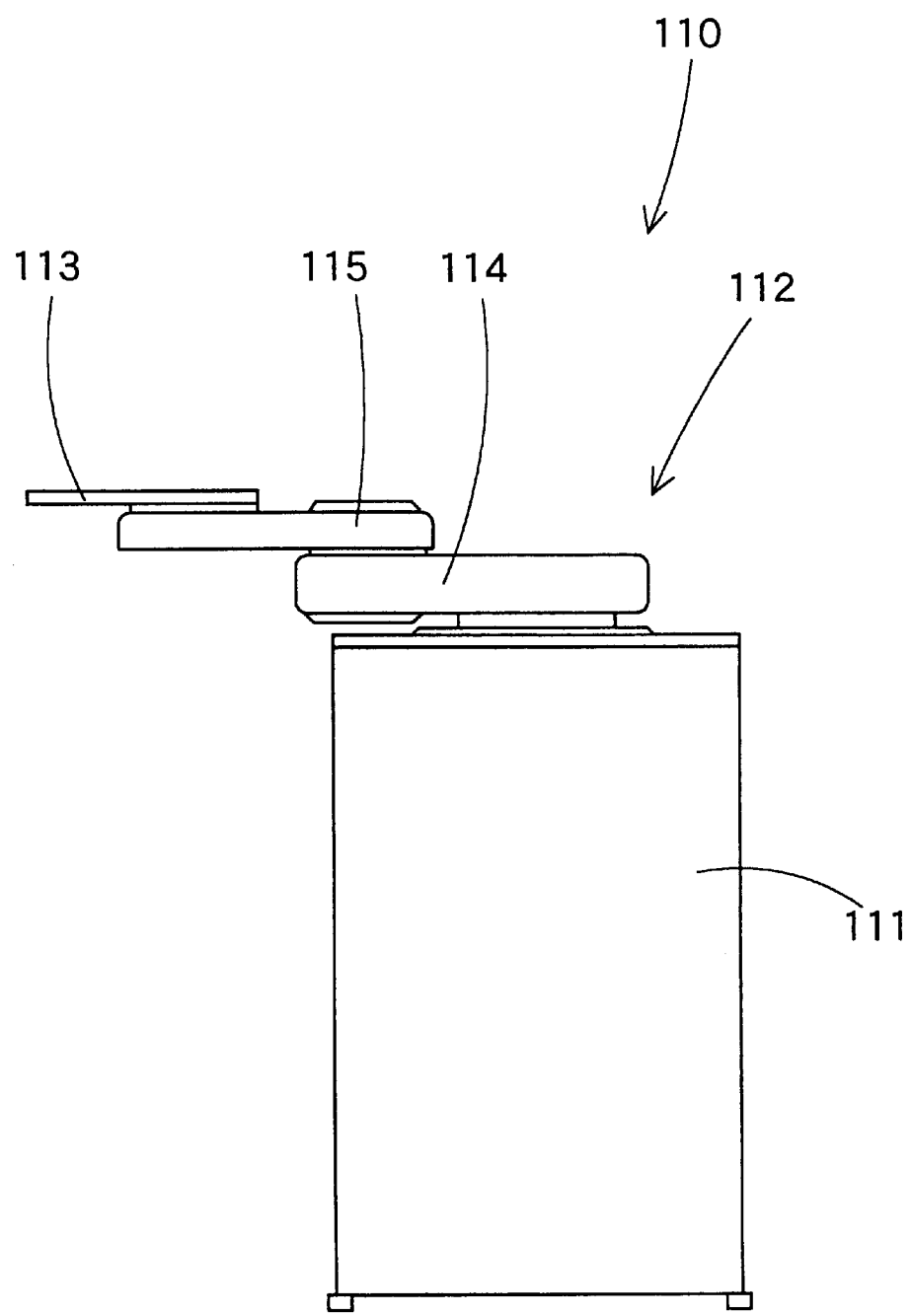
FIG. 16 is a front view showing a robot in the prior art.

The hand in the first embodiment may be that two hands are mounted rotatable on the top end of one arm set as shown in FIG. 15. In this case, a hand support part 83 is supported to the top end portion of a second link 82 of an arm set 80 having two links 81, 82, and two hands 84, 85 and a substrate detection sensor 86 are mounted in spacing of 120 degrees on the hand support part 83. The hand support part 83 is rotated with respect to the second link 82 by a motor, and the hand 84 or the hand 85 is opposed to the front surface of the cassette or the processing unit. One hand 84 fills the role to transfer the substrate out of the cassette and transfer it into the processing unit, and other hand 85 fills the role to transfer the substrate already processed out of the processing unit and house it in the cassette already processed.

In addition, individual parts in respective embodiments, for example, joining structure between respective shafts and respective arms, mounting structure of a belt and a pulley or sorts of the bearings, may be changed in design without departing from the spirit of the present invention.

Figure 17:
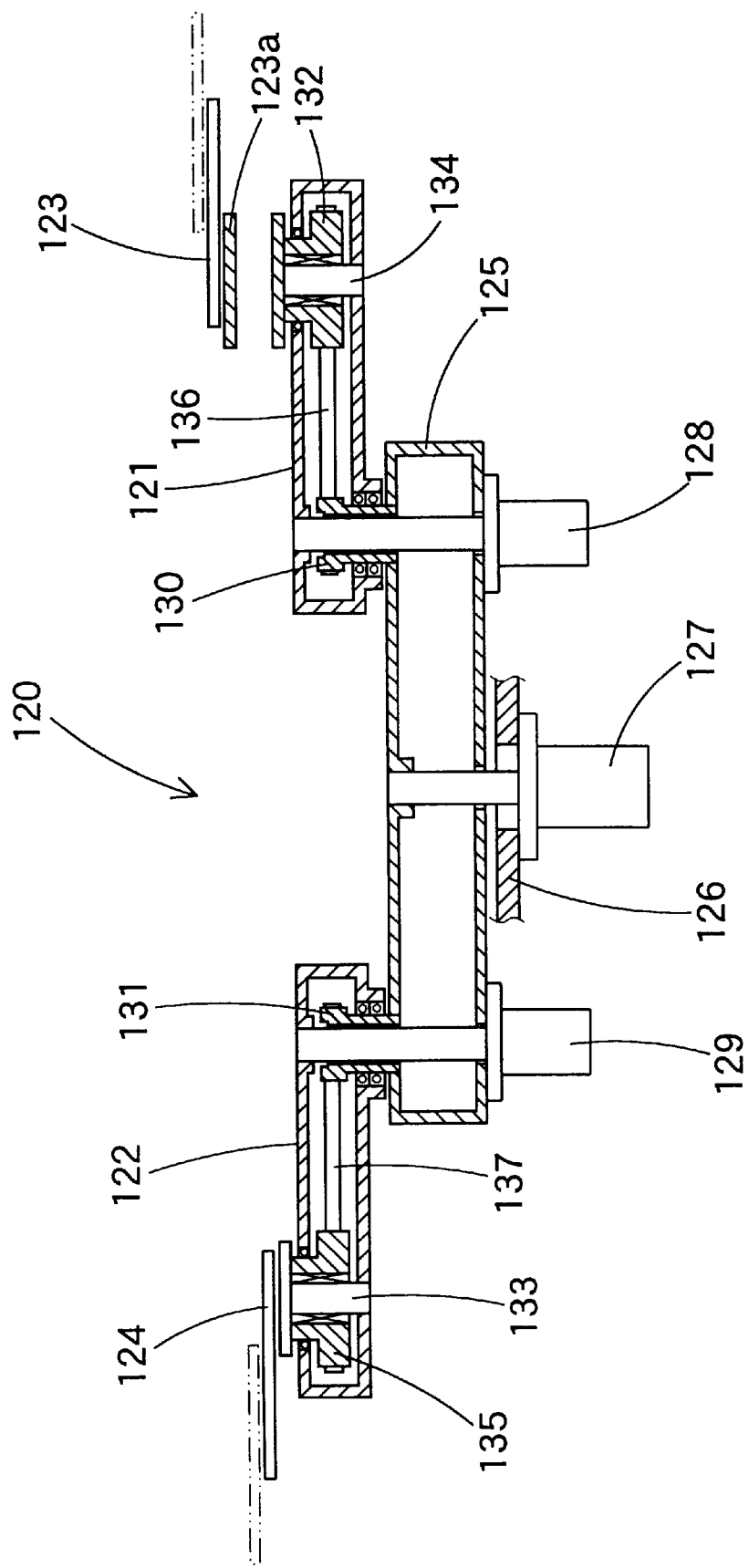
FIG. 17 is a sectional view showing a secondary swivel arm body in another embodiment.
Figure 18:
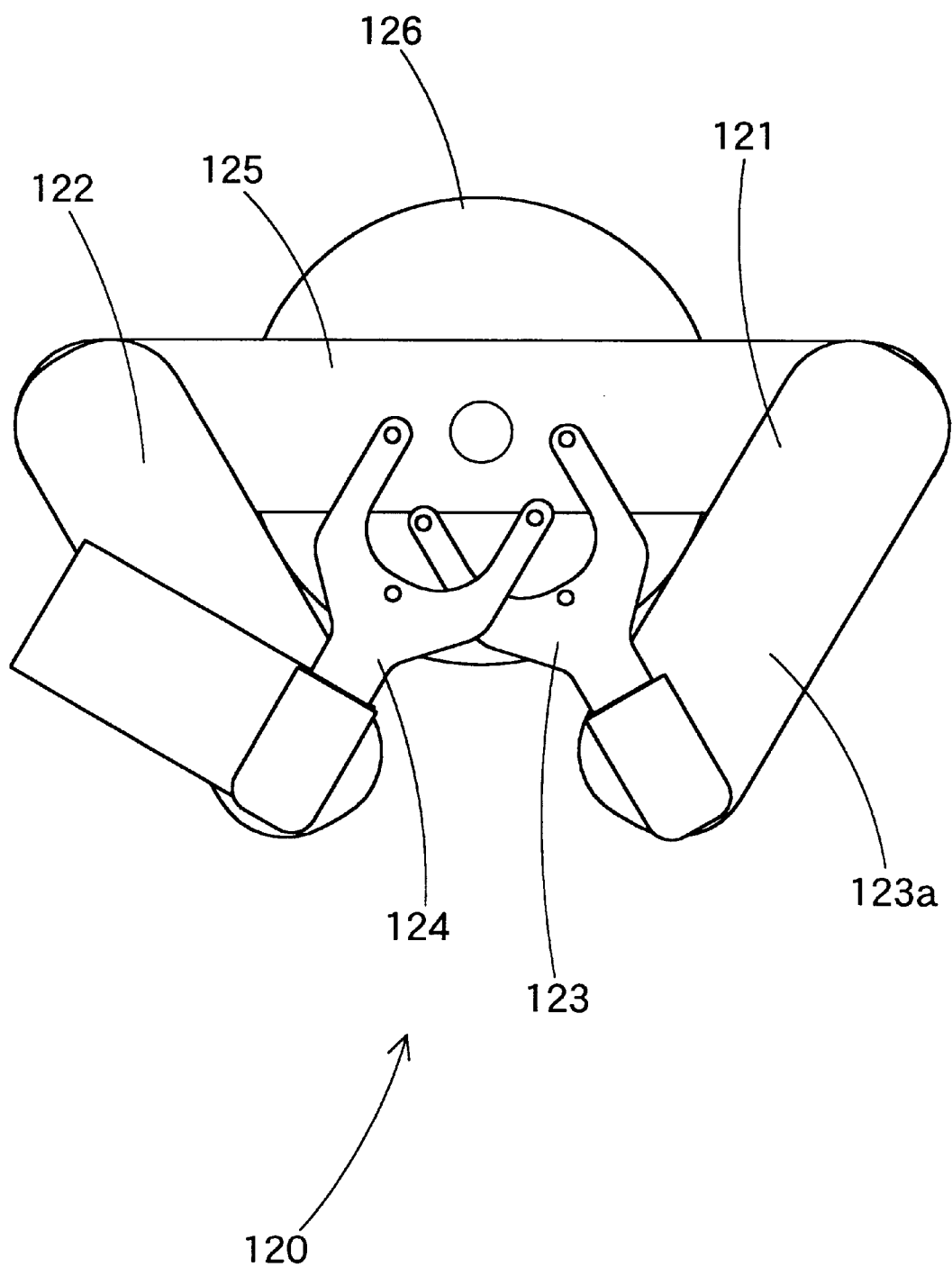
FIG. 18 is a plan view showing a secondary swivel arm body in another embodiment.

FIGS. 17–18 show another embodiment of a secondary swivel body. In this embodiment, a secondary swivel arm body 120 is has two link sets 121, 122 and hands 123, 124 mounted rotatable to the two link sets 121, 122 respectively, and the two link sets 121, 122 are respectively mounted rotatable to both ends of a common arm 125 which is supported to the movable machine bed 15 in the above-mentioned embodiment through a rotary base 126. The common arm 125 is formed in box shape and is rotated and driven by a motor 127 which is supported to the rotary base 126 at the center portion of the common arm 125, and the links 121, 122 are rotated and driven by motors 128, 129 which are formed in box shape and supported to the common arm 125 respectively.

Further the links 121, 122 are provided with small pulleys 130, 131 arranged so as to surround shafts of the motors 128, 129, large pulleys 134, 135 fixed to shafts 132, 133 supporting the hands 123, 124, and belts 136, 137 arranged joining the small pulleys 130, 131 and the large pulleys 134, 135 respectively. If the links 121, 122 are driven by the motors 128, 129, the small pulleys 130, 131, the belts 136, 137 and the large pulleys 134, 135 are rotated, and the hands 123, 124 are rotated and driven. Therefore the hand 123 joined with the link 121 and the hand 124 joined with the link 122 can move alternately to the side of the cassette 1.

Also the hands 123, 124 are formed in similar manner to the hands 33A, 33B in the above-mentioned embodiments shown in FIG. 5. One hand 123 has a substrate holding part 123a of U-like shape so that the substrate W held to other hand 124 can pass there and the upper surface part of one hand 123 is formed higher than the other hand 124.

Accordingly in the secondary swivel arm body 120, the hands 123, 124 can perform action similar to that of the hands 33A, 33B as above described by the driving of the motors 127, 128, 129. In comparison with the secondary swivel arm body (horizontal swivel arm body) 14 in the above-mentioned embodiment, the first link 31 and the motor 45 can be made one body and simplified. In addition, in this embodiment, although the common arm 125 is formed linearly in the plan view, it may be formed in bell-crank shape toward the side of the cassette 1.

What is claimed is:

1. An articulated robot for transferring a thin substrate comprising:

(a) a primary swivel unit moved in parallel along a cassette or a processing unit and driven so as to transfer the thin substrate to the vicinity of said cassette or said processing unit;

(b) a secondary swivel unit for transferring the thin substrate moved to the vicinity of said cassette or said processing unit by said primary swivel unit, into said cassette or said processing unit;

(c) said primary swivel unit being supported and swivelled in a vertical direction by a machine bed;

(d) said secondary swivel unit being supported by a movable machine bed that is supported by said primary swivel unit and being provided with a hand supporting the thin substrate and being swivelled in a horizontal direction;

(e) said primary swivel unit comprising two vertical swivel arms joined by a common shaft, and comprising a first vertical swivel arm being supported and swivelled by a first drive motor supported by the machine bed and wherein one end of a second vertical swivel arm supports the movable machine bed and is swivelled by a second drive motor connected to the common shaft;

(f) said movable machine bed comprising a driver driving said secondary swivel unit and being rotated in the vertical direction of the primary swivel unit by a third drive motor connected to the second vertical swivel arm.

2. An articulated robot for transferring a thin substrate as set forth in claim 1, wherein said secondary swivel unit has a hand supporting the thin substrate and constitutes two arm sets.

3. An articulated robot for transferring a thin substrate as set forth in claim 2, wherein said two arm sets have a common arm.

4. An articulated robot for transferring a thin substrate as set forth in claim 1, wherein the hand is provided with a sensor detecting whether or not a thin substrate exists.

* * * * *